(12) United States Patent
O'Grady et al.

(10) Patent No.: US 6,277,527 B1
(45) Date of Patent: Aug. 21, 2001

(54) METHOD OF MAKING A TWIN ALTERNATING PHASE SHIFT MASK

(75) Inventors: David S. O'Grady, Jericho, VT (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/301,778

(22) Filed: Apr. 29, 1999

(51) Int. Cl.$^7$ .................................................. G03F 9/00

(52) U.S. Cl. ............................................................ 430/5

(58) Field of Search ............................... 430/5, 322, 323, 430/324; 250/492.22

(56) References Cited

U.S. PATENT DOCUMENTS

| | | |
|---|---|---|
| 5,147,812 | 9/1992 | Gilbert et al. . |
| 5,229,230 | 7/1993 | Kamon . |
| 5,240,796 | 8/1993 | Lee et al. . |
| 5,248,574 | 9/1993 | Kamon . |
| 5,273,850 | 12/1993 | Lee et al. . |
| 5,300,379 | 4/1994 | Dao et al. . |
| 5,302,477 | * 4/1994 | Dao et al. ................................ 430/5 |
| 5,308,722 | 5/1994 | Nistler . |
| 5,308,741 | 5/1994 | Kemp . |

(List continued on next page.)

FOREIGN PATENT DOCUMENTS

| | | |
|---|---|---|
| 0 492 630 A2 | 7/1992 | (EP) . |
| 2 295 694 A | 6/1996 | (GB) . |
| 283251 | 8/1996 | (TW) . |

OTHER PUBLICATIONS

Onodera, Toshio; Kuwahara, Kazuyuki; Ohtsuka, Hiroshi— "Conjugate Twin–Shifter Phase Shift Method for High Resolution Lithography" OKI Technical Review (Dec. 1993) vol. 59, pp., 47–50.

Pierrat, C.; DeMarco, J.; "Phase–Shifting Mask Fabrication" SPIE vol. 2087 Photomask Technology and Management (1993) pp. 362–371.

Gaspar Wilson, Susan M.; Marchman, Herschel M., Naqvi, S. Sohail H.; McNeil, John T., "Phase Shift Mask Metrology Using Scatterometry" SPIE, vol. 2322 Photomask Technology and Management (1994) pp. 305–315.

(List continued on next page.)

Primary Examiner—S. Rosasco
(74) Attorney, Agent, or Firm—DeLio & Peterson, LLC; Kelly M. Reynolds; Howard J. Walter, Jr.

(57) ABSTRACT

A photolithographic mask comprises a first plurality of image segments etched into a mask substrate to a first level imparting a predetermined phase shift with respect to electromagnetic radiation of a predetermined frequency, preferably a 90° phase shift, and a second plurality of image segments etched into the mask substrate to a second level imparting a phase shift of 180° more or less than the phase shift of the first plurality of image segments with respect to the predetermined electromagnetic radiation, preferably a 270° phase shift. The first and second segments are disposed adjacent each other on a substrate and positioned such that an intersection of the predetermined electromagnetic radiation passing through the segments causes printable images to be created below the substrate when exposed to the predetermined electromagnetic radiation. The mask may further include a blocking material for the electromagnetic radiation, adjacent at least one of the first and second segments or regions, of a configuration adapted to cause a printable image to be created below the mask when exposed to the predetermined electromagnetic radiation.

22 Claims, 7 Drawing Sheets

U.S. PATENT DOCUMENTS

| | | |
|---|---|---|
| 5,342,713 | 8/1994 | Ohtsuka et al. . |
| 5,370,975 | 12/1994 | Nakatani . |
| 5,482,801 | 1/1996 | Smith et al. . |
| 5,484,672 | 1/1996 | Bajuk et al. . |
| 5,487,962 | 1/1996 | Rolfson . |
| 5,489,509 | 2/1996 | Kawabata et al. . |
| 5,503,951 | 4/1996 | Flanders et al. . |
| 5,506,080 | 4/1996 | Adair et al. . |
| 5,532,090 | 7/1996 | Borodovsky . |
| 5,533,634 | 7/1996 | Pan et al. . |
| 5,549,995 | 8/1996 | Tanaka et al. . |
| 5,620,816 | 4/1997 | Dao . |
| 5,636,131 | 6/1997 | Liebmann et al. . |
| 5,795,685 | 8/1998 | Liebmann et al. . |
| 5,807,649 | 9/1998 | Liebmann et al. . |
| 5,985,492 * | 11/1999 | Wheeler et al. .......................... 430/5 |

OTHER PUBLICATIONS

Li, Gerald; Ku, Yao–Ching; Lea, William Henry; "Strong Phase Shifter Mask Application to 0.25 um and 0.35 um Technologies" SPIE vol. 2440, pp. 796–803.

Dusa, Mircea V.; Karklin, Linard, "Metrology vs. Detection Strategies for Sub Half Micron Reticles" SPIE vol. 2439, pp. 243–252.

Gaspar Wilson, Susan M.; Naqvi, S. Sohail H.; McNeil, John R.; Marchman, Herschel M.; Johs, Blaine; French, Roger H; Kalk, Franklin D.; "Metrology of Etched Quartz and Chrome Embedded Phase Shift Gratings Using Scatterometry", SPIE vol. 2439 pp. 479–494.

Liu, Yong; Zakhor, Avideh; Zuniga, Marco A. "Computer–Aided Phase Shift Mask Design with Reduced Complexity" IEEE Transactions on Semiconductor Manufacturing, vol. 9, No. 2 May 1996 pp. 170–181.

Terasawa, Tsuneo; Hasegawa, Norio; Imai, Akira; Okazaki, Shinji, "Analysis of Nonplanar Topography Effects of Phase Shift Masks on Imaging Characteristics" Japanese Journal of Applied Physics, vol. 34 (1995) pp. 6578–6583.

Ohtsuka, H; Abe, K.; Onodera, T.; Kuwahara, K.; Taguchi, T.; "Conjugate Twin–Shifter for the New Phase Shift Method to High Resolution Lithography" SPIE, vol. 1463 Optical/Laser Microlithography IV (1991) pp. 112–123.

* cited by examiner

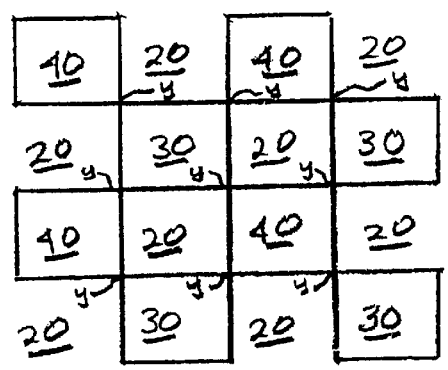
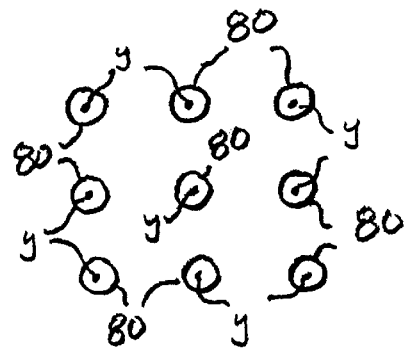
Fig. 8          Fig. 9
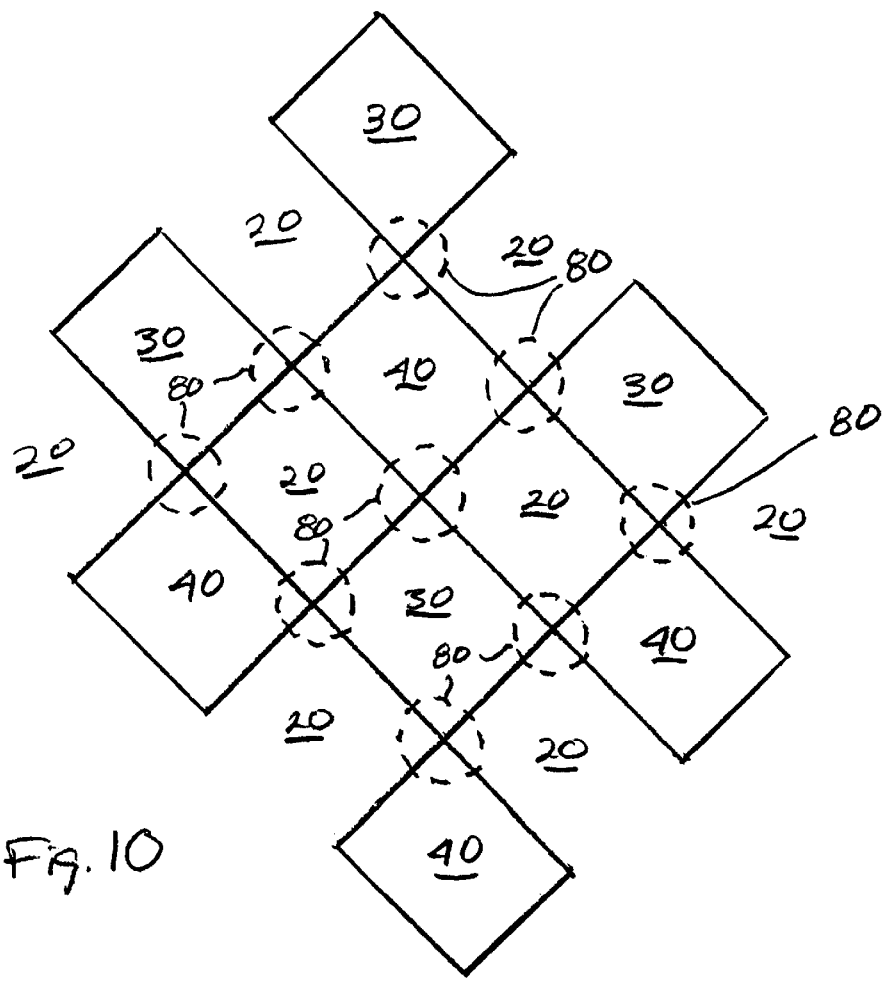
Fig. 10

METHOD OF MAKING A TWIN ALTERNATING PHASE SHIFT MASK

BACKGROUND OF THE INVENTION

1. Field of the Invention

The present invention relates to masks employed in photolithography processes used to make microelectronic components and, in particular, to a phase shift mask for such photolithography.

2. Description of Related Art

In producing microelectronic contacts and wiring on wafers using photolithographic processes, a major concern is how to print the smallest lines onto the wafer using optics.

Chrome or other light blocking materials used on masks have limitations at the line width where conventional resolution is lost, and may not be used below these line widths, presently about 0.2 microns. Moreover, the masks are sensitive to defects therein.

Phase shift masks have been well known wherein etching and/or additive methods have been used to impart a phase shift to light passing through the mask, for example, in U.S. Pat. Nos. 5,342,713 and 5,549,995. However, such phase shift masks have not been used to create images without use of chrome or other blocking material.

Bearing in mind the problems and deficiencies of the prior art, it is therefore an object of the present invention to provide a photolithographic mask which has improved capability to produce printable images at or below the limit of optical resolution of the photolithographic process.

It is another object of the present invention to provide a photolithographic mask which is not subject to the limitations of imaging conventional chrome blocking layers.

A further object of the invention is to provide a simplified phase shift mask and method of making such mask which is less sensitive to mask defects.

It is yet another object of the present invention to provide a photolithographic mask which is of simpler design.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a photolithographic mask comprising a first plurality of image segments imparting a predetermined phase shift with respect to electromagnetic radiation of a predetermined frequency and a second plurality of image segments imparting a phase shift of 180° more or less than the phase shift of the first plurality of image segments with respect to the predetermined electromagnetic radiation. The first and second segments are disposed on a substrate and positioned such that an intersection of the predetermined electromagnetic radiation passing through the segments causes printable images to be created below the substrate when exposed to the predetermined electromagnetic radiation. Preferably, the first and second plurality of image segments are etched into a surface of the substrate at different levels below the surface. In one embodiment, the first plurality of image segments impart a phase shift of 90° with respect to the electromagnetic radiation of a predetermined frequency and the second plurality of image segments impart a phase shift of 270° with respect to the electromagnetic radiation of a predetermined frequency.

In another aspect, the present invention provides a photolithographic mask comprising a substrate adapted to permit transmission of electromagnetic radiation therethrough, the substrate having a surface, a first region on the substrate at a level below the surface adapted to impart a predetermined phase shift with respect to the electromagnetic radiation, and a second region on the substrate at a different level below the surface adapted to impart a phase shift of 180° more or less than the phase shift of the first region with respect to the electromagnetic radiation. The second region is adjacent the first region and forms a desired configuration such that, upon transmission of the electromagnetic radiation through the substrate and the first and second regions, the radiation interferes so as to cause printable images corresponding to the configuration to be created below the substrate when exposed to the electromagnetic radiation. Preferably, the first region imparts a phase shift of about 90° with respect to the electromagnetic radiation and the second region imparts a phase shift of about 270° with respect to the electromagnetic radiation.

The first and second segments or regions may be positioned directly adjacent each other on the substrate and may also contact each other on the substrate. Preferably, the first and second segments or regions are positioned directly adjacent each other on the substrate without an intervening blocking material for the electromagnetic radiation of a predetermined frequency.

The mask may further include a blocking material for the electromagnetic radiation adjacent at least one of the first and second segments or regions. Such blocking material may be of a configuration adapted to cause a printable image to be created below the mask when exposed to the predetermined electromagnetic radiation. The first and second segments or regions may intersect along lines or points of a desired configuration such that the printable images conform to the lines or points, respectively.

In a related aspect, the present invention provides a method of producing a photolithographic mask comprising providing a substrate and creating in the substrate a first and second plurality of image segments. The first plurality of image segments imparting a predetermined phase shift with respect to electromagnetic radiation of a predetermined frequency and the second plurality of image segments imparting a phase shift of 180° more or less than the phase shift of the first plurality of image segments with respect to the predetermined electromagnetic radiation. The second segments being positioned adjacent the first segments such that printable images may be created below the substrate, when exposed to the predetermined electromagnetic radiation, at an intersection of the first and second segments.

Preferably, the method is performed by etching the first and second plurality of image segments into a surface of the substrate at different levels below the surface. More preferably, the first plurality of image segments are etched to impart a phase shift of 90° with respect to the electromagnetic radiation of a predetermined frequency and the second plurality of image segments are etched to impart a phase shift of 270° with respect to the electromagnetic radiation of a predetermined frequency.

In a further aspect, the present invention relates to a method of creating an image comprising providing a photolithographic mask having a first plurality of image segments imparting a predetermined phase shift with respect to electromagnetic radiation of a predetermined frequency and a second plurality of image segments imparting a phase shift of 180° more or less than the phase shift of the first plurality of image segments with respect to the predetermined electromagnetic radiation. The first and second segments are positioned adjacent each other on a substrate. The method then includes transmitting the predetermined electromagnetic radiation through the first and second image segments such that printable images are created at an intersection of the radiation below the substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 8 is a top plan view of a 4×4 twin alternating phase shift mask made in accordance with the present invention.

FIG. 9 is a top plan view of the contact image formed in a negative resist exposed using the mask of FIG. 8.

FIGS. 10, 11 and 12 are top plan views of other twin alternating phase shift masks made in accordance with the present invention and, superimposed thereon, the contact images formed in negative resists exposed using the masks.

DESCRIPTION OF THE PREFERRED EMBODIMENT(S)

Figure 1:
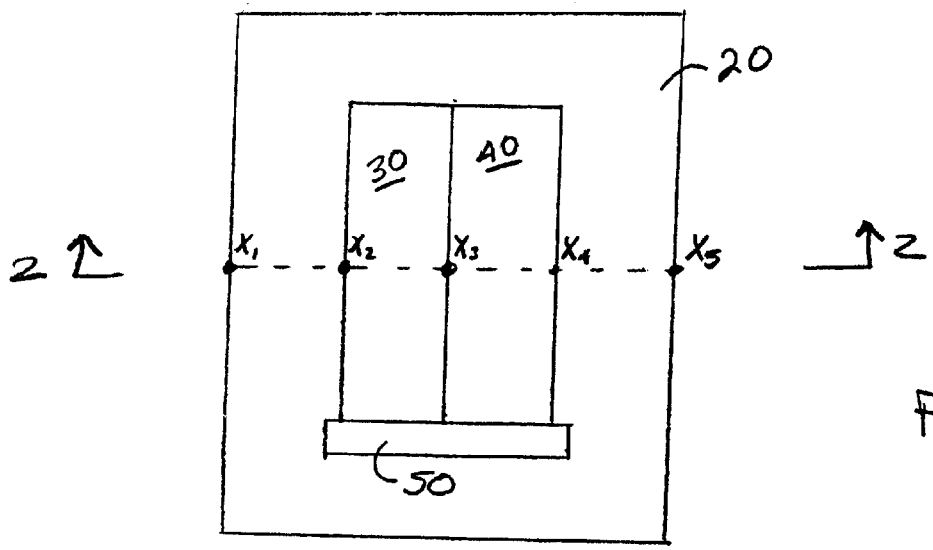
FIG. 1 is a top plan view of one embodiment of a twin alternating phase shift mask made in accordance with the present invention.

In describing the preferred embodiment of the present invention, reference will be made herein to FIGS. 1–21 of the drawings in which like numerals refer to like features of the invention. Features of the invention are not necessarily shown to scale in the drawings.

The present invention uses what is referred to herein as a "twin alternating" approach to make a phase shift mask, with no chrome or other radiation blocker necessary to separate the two phase steps. This results in a sharp image contrast where the two phase steps meet at a 180° step, while the two closed loop segments or regions imparting 90° and 270° phase shifts do not print at wafer level. This method can be used to print lines in positive resist on a wafer, or to print contacts in negative resist on a wafer. This approach brings many advantages, which make it relatively easy to apply to printing 0.1 $\mu$m images with 248 nm light exposure, for example. It is relatively insensitive to defects, and it is possible to design many different shapes, as well as integrate chrome images, to form larger images.

Preferably, the invention provides two recessions or etches into the quartz mask substrate, such that radiation passing through the two recessed regions comes together to cause phase cancellation. This phase cancellation is used to print minimum size images, with no aperture (chrome or otherwise) in the area. The invention can print lines (in positive resist) or contacts (in negative resist) by varying the layout of the recessed shapes.

The invention can use 90° and 270° recessions in the quartz substrate to make the 180° phase edge locations, or any combination of recession depths which are different by 180°.

In FIG. 1, there is shown a quartz substrate 20 of the type typically employed to make a phase shifting mask for use in a photolithographic process for forming contact or wiring patterns on a wafer. The substrate 20 may be any other material which is transparent to the predetermined radiation frequency to be used in the photolithographic process, and made to a thickness such that it preferably imparts a 0° phase shift to the radiation. Printed by conventional techniques on substrate 20 is a blocking or shading layer 50 of chromium or chromium dioxide which blocks the radiation and creates a shaded area of desired configuration on the photoresist layer below the mask. In accordance with the present invention, however, an image is also printed without chromium layer 50, by the use of regions 30 and 40 on substrate 20, which impart a 90° phase shift and 270° phase shift, respectively, to the radiation passed through the mask.

As seen more clearly in FIG. 2, regions 30 and 40 are preferably formed by etching two different levels below the surface of substrate 20 such that region 30 imparts the desired 90° shift and region 40 imparts the desired 270° phase shift. While the precise phase shift of regions 30 and 40 is not critical, it is important that the difference in the phase shift between the two regions be approximately 180° to provide the desired cancellation, as will be explained further below. Thus, for example, region 30 may be utilized to impart an 80° phase shift and region 40 may be constructed to impart a 260° phase shift, with the difference still being about 180°. In addition to etching, regions 30 and 40 may be made by additive processes to add layers above the surface of the quartz substrate 20 to impart the desired phase shift.

Figure 3:
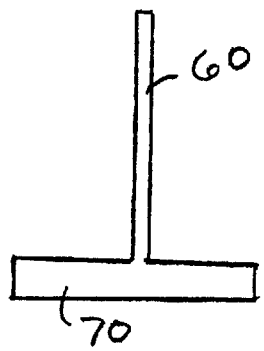
FIG. 3 is a top plan view of the image created by the mask of FIG. 1 on a positive resist layer in a photolithographic process.

As shown in FIG. 3, the image which is printed on a positive resist below the mask consists of line region 70 which is formed by the conventional shading of chrome layer 50, and line region 60 which is formed by the cancellation of the radiation passing through each of the regions 30 and 40.

Figure 4:
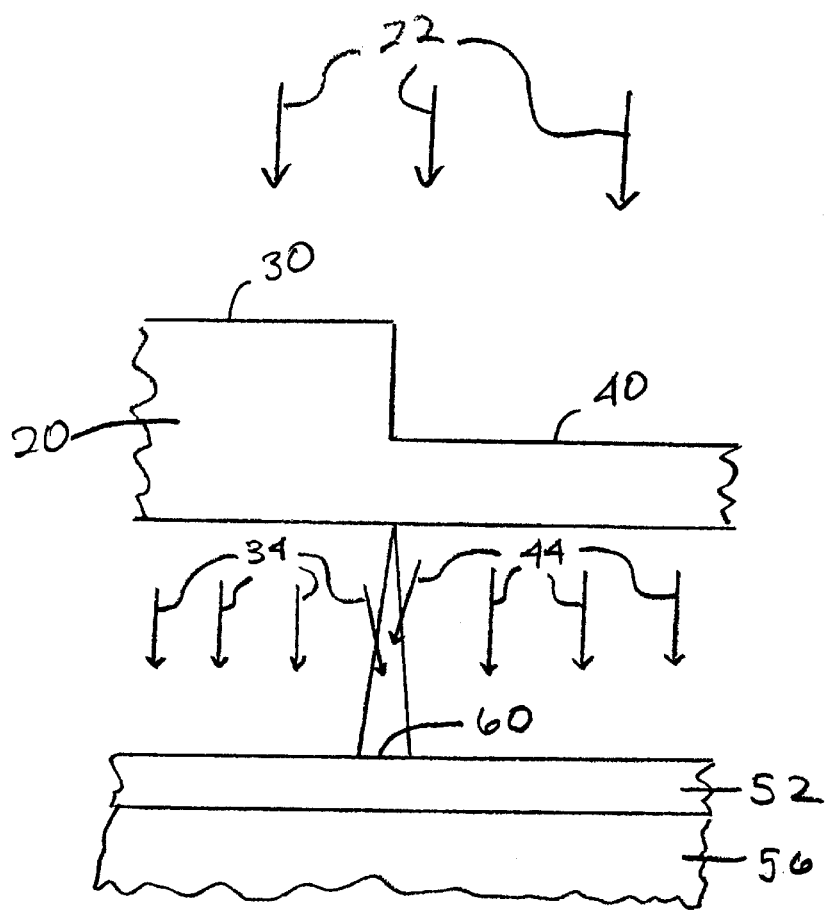
FIG. 4 is a side elevational view of a portion of the mask of FIG. 1, seen along line 2—2, used in a photolithographic process to create an image on a positive resist layer.

FIG. 4 illustrates this process more clearly. Mask substrate 20 is used to transmit radiation 22 to substrate 56 having thereon a positive resist layer 52. Radiation 22 passing through mask region 30 is imparted a 90° phase shift and the resulting radiation is shown by arrows 34. On the other hand, radiation passing through region 40 is imparted a 270° phase shift, as shown by the radiation identified by arrows 44. In the region of intersection of 90° phase shifted radiation 34 and 270° phase shifted radiation 44, the radiation is cancelled out by the 180° phase shift differential. This results in only a region 60 on resist 52 on which the image is either printed (positive resist) or not printed (negative resist). Higher transmitted radiation levels are received on layer 52 outside of region 60.

Figure 2:
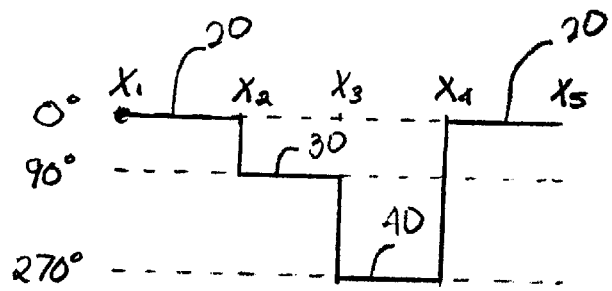
FIG. 2 is a cross-sectional view of the mask of FIG. 1 along line 2—2 showing the etched step configuration of the phase shifting regions.
Figure 5:
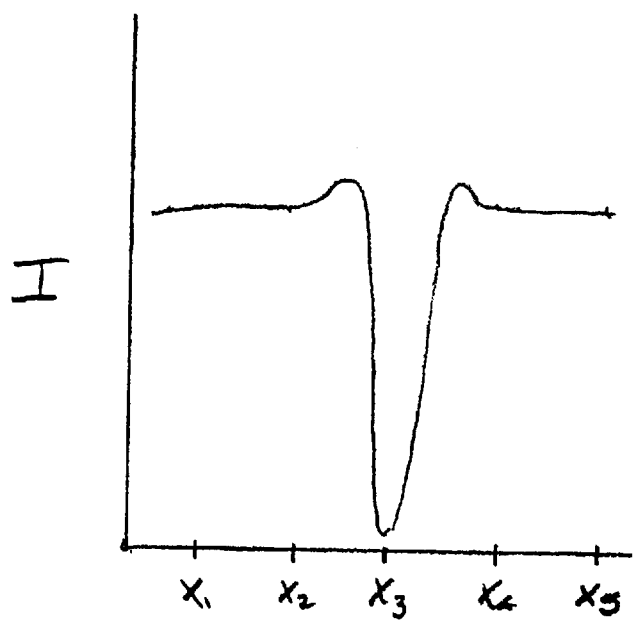
FIG. 5 is a graphical depiction of the transmitted radiation intensity of the mask of FIG. along line 2—2.

The transmitted radiation intensity at points $x_1$, $x_2$, $x_3$, $x_4$ and $x_5$ corresponding to the position shown in FIGS. 1 and 2 is illustrated in FIG. 5. As can be seen, the intensity at point $x_3$, which corresponds to image 60 in FIGS. 3 and 4, is at a very low level compared to the radiation at the other points $x_1$, $x_2$, $x_4$ and $x_5$.

Figure 6:
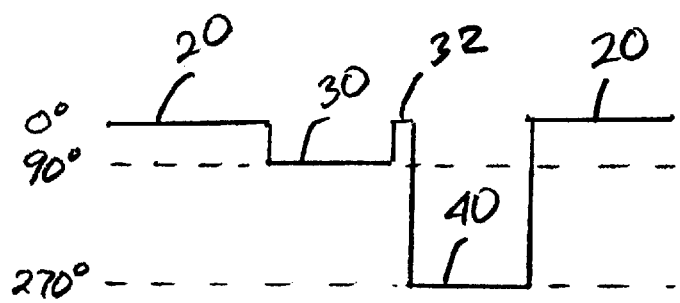
FIG. 6 is an alternate embodiment of FIG. 2 depicting a different step configuration of the phase shifting regions.
Figure 7:
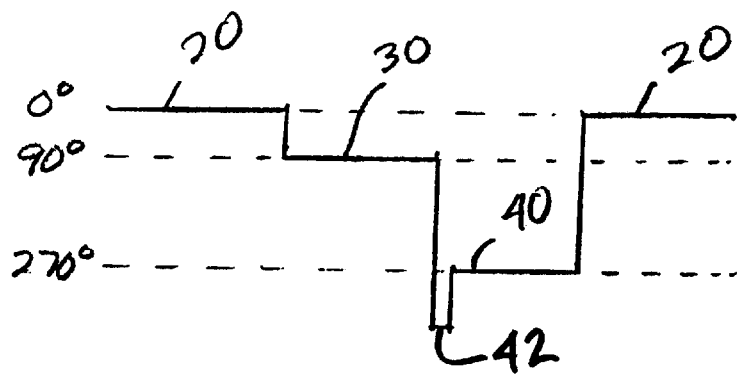
FIG. 7 is another alternate embodiment of FIG. 2 depicting a different step configuration of the phase shifting regions.

As shown in FIGS. 6 and 7, overlay and image size may be critical if 90° and 270° phase shift regions are etched independently. Variations in the placement of region 30 relative to region 40 can create a mismatch in the abutment of regions 30 and 40. This can result in the modified structures shown in FIGS. 6 and 7. For example, in FIG. 6, an unetched pillar 32 remains between regions 30 and 40, and in FIG. 7, an overetched pit 42 is between regions 30 and 40, each being the result of resist layer placement errors during independent etching. However, this is not necessarily undesirable when the abutment of regions 30 and 40 is nearly accomplished, as shown, so that the phase shifted radiation still intersects to cancel out the radiation (FIG. 4). Regions 30 and 40 can be made self-aligned by not etching each independently to completely eliminate this mismatch.

By configuring the region of intersection of the radiation passing through the segments having the 180° phase shift differential (where the radiation interferes so as to significantly reduce intensity), various desired shapes can be printed on a resist layer by the mask of the present invention.

For example, in FIG. 8 a 4×4 mask having square 0° phase shift regions 20, 90° phase shift regions 30, and 270° phase shift regions 40 can be prepared as shown in the plan view in FIG. 8. Each square has a dimension of approximately 0.8 microns. The square etched regions 30 and 40 intersect at points y, where the interference occurs on the resist layer below. After illumination with the radiation and printing on a resist layer, FIG. 9 illustrates that the negative resist layer utilized would have a series of image points 80, corresponding only to the locations of intersection y, which can be used to form contacts on the substrate using a photolithographic process. The resulting spacing between the contacts 80 is approximately 0.1 micron.

Figure 11:
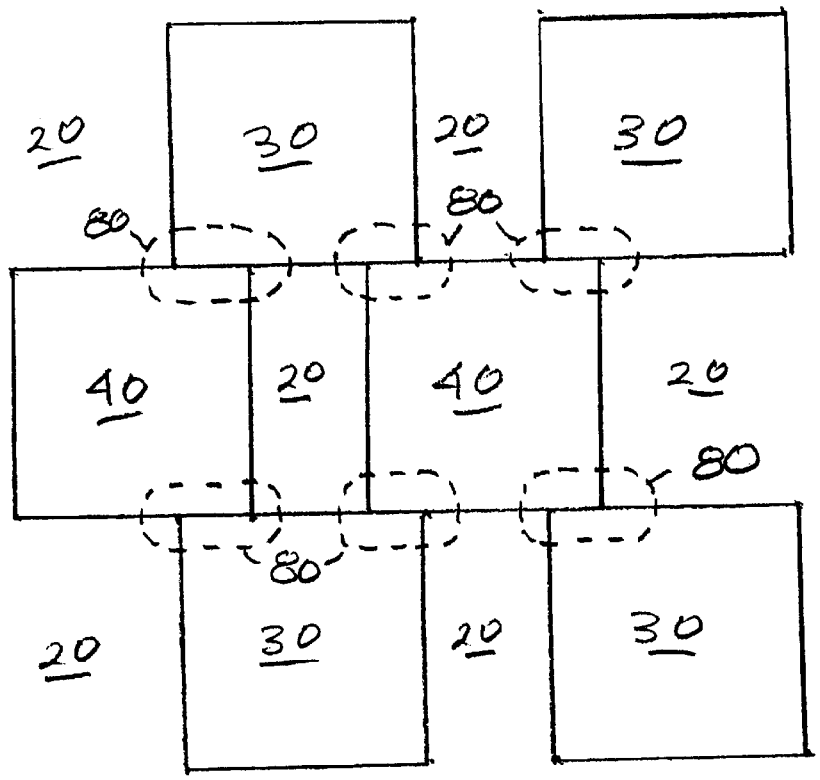
Figure 12:
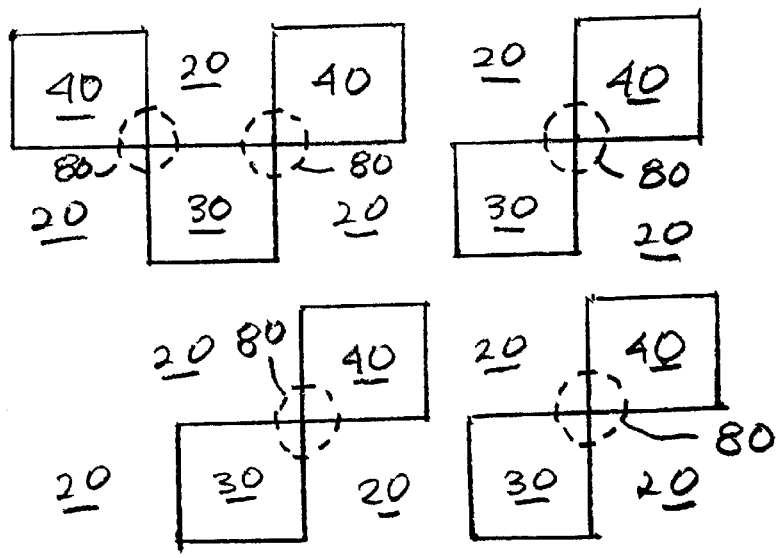

Various other line and contact patterns are shown in FIGS. 10, 11 and 12, wherein only the intersections of regions 30 and 40 produce printable images, shown by superimposed phantom lines 80. In FIG. 10, there is produced a memory contact array 80 which has a square pattern similar to FIG. 8 but rotated 45°. In FIG. 11 there is shown another design for memory contact array which produces elongated contact (or short line) arrays 80. In FIG. 12 there is shown a design for logic contacts with a varying pattern which produces contacts 80 on the resist layer.

Figure 13:
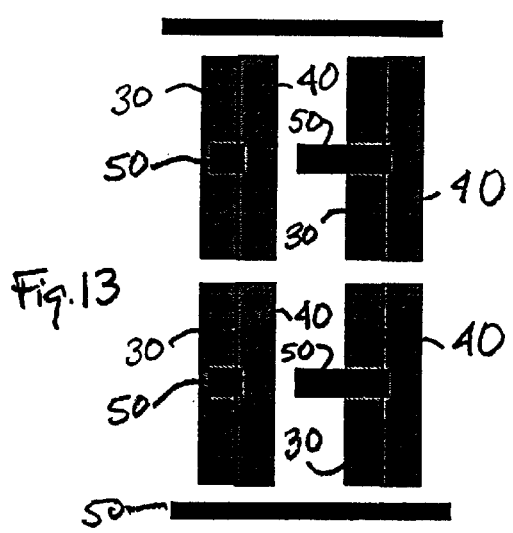
FIG. 13 is a top plan view of a mask design for a memory gate layout in accordance with the present invention.
Figure 14:
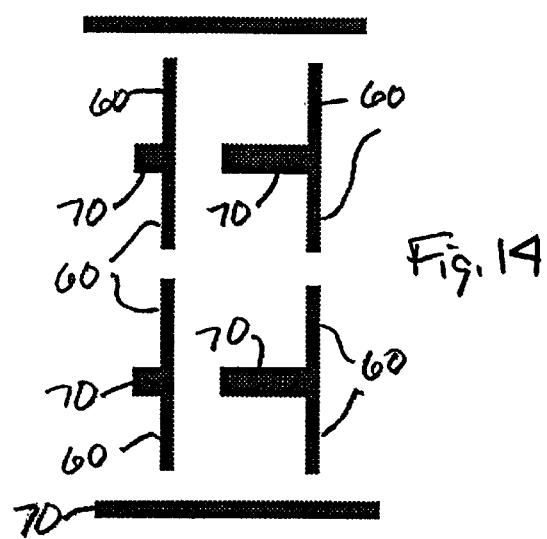
FIG. 14 is a top plan view of the printed memory gate layout on a wafer made by a photolithographic process using the mask design of FIG. 13.

FIG. 13 shows a mask configuration for a memory gate layout which utilizes 90° phase shift regions 30, 270° phase shift regions 40 and chrome regions 50, which produces the resulting printed wafer result, utilizing a positive resist. In FIG. 14, printed regions 60 correspond to the intersection of radiation passing through phase shift regions 30 and 40, while printed regions 70 result from the shading provided by chrome regions 50.

Figure 15:
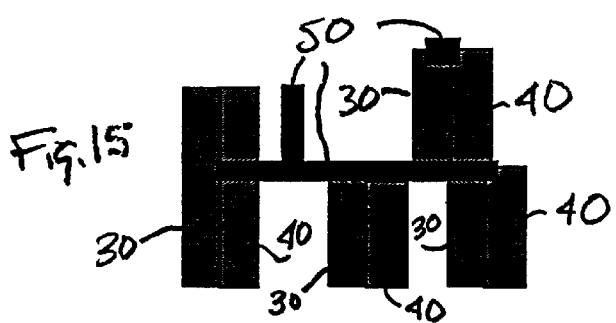
FIG. 15 is a top plan view of a mask design for a memory gate layout in accordance with the present invention.
Figure 16:
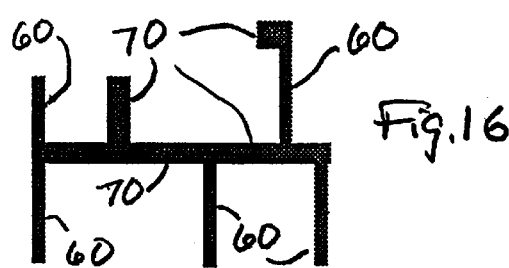
FIG. 16 is a top plan view of the printed memory gate layout on a wafer made by a photolithographic process using the mask design of FIG. 15.

Another mask design for a logic gate utilizing various shapes of chrome 50 and adjacent phase shift regions 30 and 40 is shown in FIG. 15, with the resulting printed wafer result utilizing positive resist shown in FIG. 16.

It has been found that a 180° phase shift step in a quartz mask will result in the smallest possible image at the wafer. Preferably the segments or regions imparting the 180° phase shift differential are positioned directly adjacent to and contact each other on a substrate without an intervening blocking material. However, it is possible to separate these segments and optionally use an intervening radiation blocking material to obtain the same interfering results on the printed photoresist.

The present invention provides ultimate phase shift resolution and ultimate optical resolution. Design simplicity is accomplished by non-printing of the phase transition regions. This reduces the sensitivity to mask defects and eliminates the need for a second exposure to remove unwanted printing phase transitions on prior art masks. The invention is relatively simple to manufacture and provides for flexible design layout to produce desired wiring and contact patterns using a photolithographic process. Additionally, the mask of the present invention preferably is based on quartz etching, with no additive film deposition required to produce the 90° and 270° phase shifting regions.

Figure 17:
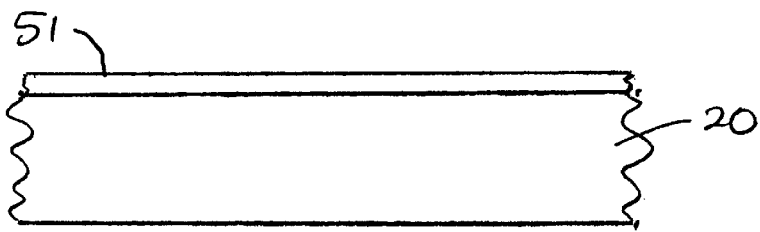
FIGS. 17–21 are cross-sectional views of a mask substrate depicting the process steps to make a twin alternating phase shift mask in accordance with the present invention.
Figure 18:
Figure 19:
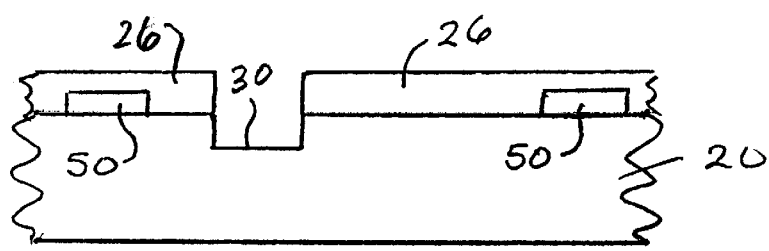
Figure 20:
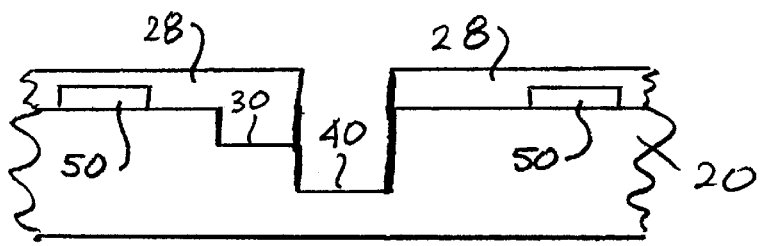
Figure 21:
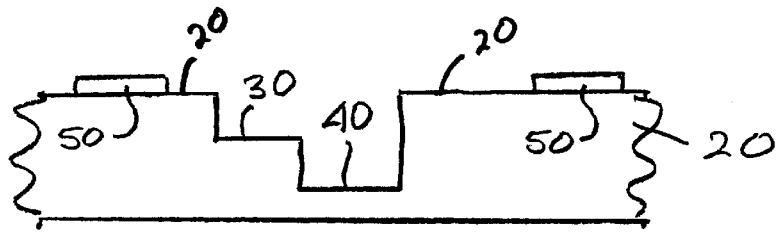

To manufacture the twin alternating phase shift mask of the present invention, first obtain a quartz mask substrate 20 with chrome or other blocking film 51 on a surface of the mask, as shown in FIG. 17. Next, image the chrome using conventional mask fabrication techniques to obtain the desired chrome blocking segments 50 (FIG. 18). All of the design images larger than the critical line width where conventional resolution is lost, e.g., 0.3 microns, are fabricated into the chrome. Apply a first resist layer 26 and image the first portion of the structure in the configuration of the desired 90° phase shift segment, develop the image and etch the quartz substrate 20 to make the 90° phase shift segment 30, as shown in FIG. 19. Then, apply a second resist layer 28 over the mask and 90° step, image the second portion of the structure in the configuration of the desired 270° phase shift segment, develop the image and etch the quartz substrate 20 to make the 270 phase shift segment 40, as shown in FIG. 20. This makes a 180° step between phase shift segments 30 and 40. In this example, to create printable images in a photolithographic process, the final phase shift mask has both a 180° difference between phase shift segments 30 and 40, as well as conventional chrome layer segments 50, as shown in FIG. 21.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A photolithographic mask comprising:
   a first image segment having an image segment width, the first image segment imparting a predetermined phase shift with respect to electromagnetic radiation of a predetermined frequency; and
   a second image segment imparting a phase shift of 180° more or less from an edge of the phase shift of said first image segment with respect to the predetermined electromagnetic radiation, said first and second segments being on a substrate adjacent to each other and positioned such that at an intersection of said predetermined electromagnetic radiation passing through said segments, said electromagnetic radiation passing through said segments is cancelled out by the phase shift of 180° more or less differential between the edges of said first and second image segments causing printable images having a width less than the image segment width to be created below said substrate and between the image segments when exposed to said predetermined electromagnetic radiation.

2. The mask of claim 1 wherein said first and second image segments are etched into a surface of said substrate at different levels below the surface.

3. The mask of claim 1 wherein said first image segment imparts a phase shift of 90° with respect to said electromagnetic radiation of a predetermined frequency and said second image segment impart a phase shift of 270° with respect to said electromagnetic radiation of a predetermined frequency.

4. The mask of claim 1 wherein said first and second segments are positioned directly adjacent each other on said substrate.

5. The mask of claim 1 wherein said first and second segments contact each other on said substrate.

6. The mask of claim 1 wherein said first and second segments are positioned directly adjacent each other on said substrate without an intervening blocking material for said electromagnetic radiation of a predetermined frequency.

7. The mask of claim 6 further including a blocking material for said predetermined electromagnetic radiation adjacent at least one of said first and second segments.

8. The mask of claim 1 further including on said mask a blocking material for said predetermined electromagnetic radiation of a configuration adapted to cause a printable image to be created below said substrate when exposed to said predetermined electromagnetic radiation.

9. The mask of claim 1 wherein said first and second segments intersect along lines of a desired configuration and said printable images conform to said lines.

10. The mask of claim 1 wherein said first and second segments intersect along points of a desired configuration and said printable images conform to said points.

11. A photolithographic mask comprising:

a substrate adapted to permit transmission of electromagnetic radiation therethrough, said substrate having a surface;

a first region on said substrate at a level below said surface adapted to impart a predetermined phase shift with respect to said electromagnetic radiation; said first region having a width, and a second region on said substrate at a different level below said surface adapted to impart a phase shift of 180° more or less than the phase shift of said first region with respect to said electromagnetic radiation, said second region being adjacent said first region and forming a desired configuration such that, upon transmission of said electromagnetic radiation through said substrate and said first and second regions, said radiation interferes at a location below the substrate and between the first and second regions whereby said electromagnetic radiation passing through said segments is cancelled out by the phase shift of 180° more or less differential between the edges of said first and second image segments so as to cause printable images having a width less than the width of the first region corresponding to said configuration to be created below said substrate and between the first and second regions when exposed to said electromagnetic radiation.

12. The mask of claim 11 wherein said first region imparts a phase shift of about 90° with respect to said electromagnetic radiation and said second region imparts a phase shift of about 270° with respect to said electromagnetic radiation.

13. The mask of claim 11 wherein said first and second regions contact each other on said substrate.

14. The mask of claim 11 wherein said first and second regions are positioned directly adjacent each other on said substrate without an intervening blocking material for said electromagnetic radiation of a predetermined frequency.

15. The mask of claim 14 further including a blocking material for said electromagnetic radiation adjacent at least one of said first and second regions.

16. The mask of claim 11 further including on said substrate a layer of a blocking material for said predetermined electromagnetic radiation of a configuration adapted to cause a printable image to be created below said substrate when exposed to said predetermined electromagnetic radiation.

17. The mask of claim 11 wherein said first and second regions intersect along lines of a desired configuration and said printable images conform to said lines.

18. The mask of claim 11 wherein said first and second regions intersect along points of a desired configuration and said printable images conform to said points.

19. A method of producing a photolithographic mask comprising:

providing a substrate;

creating in said substrate a first image segment having an image segment width, the first image segment imparting a predetermined phase shift with respect to electromagnetic radiation of a predetermined frequency; and creating a second image segment adjacent said first image segment imparting a phase shift of 180° more or less from an edge of the phase shift of said first image segment with respect to the predetermined electromagnetic radiation, said second segment being positioned adjacent said first segment, wherein a printable image having a width less than the image segment width may be created at an intersection of said first and second segments below said substrate by said electromagnetic radiation passing through said segments being cancelled out by the phase shift of 180° more or less differential between the edges of said first and second image segments when exposed to said predetermined electromagnetic radiation.

20. The method of claim 19 wherein said first and second image segments are etched into a surface of said substrate at different levels below the surface.

21. The method of claim 20 wherein said first image segment is etched to impart a phase shift of 90° with respect to said electromagnetic radiation of a predetermined frequency and said second image segment is etched to impart a phase shift of 270° with respect to said electromagnetic radiation of a predetermined frequency.

22. A method of creating an image comprising:

providing a photolithographic mask having a first image segment having an image segment width, the first image segment imparting a predetermined phase shift with respect to electromagnetic radiation of a predetermined frequency and a second image segment imparting a phase shift of 180° more or less from an edge of the phase shift of said first image segment with respect to the predetermined electromagnetic radiation, said first and second segments being positioned adjacent each other on a substrate; and transmitting said predetermined electromagnetic radiation through said first and second image segments such that printable images are created at an intersection of the radiation below said substrate and between said first and second image segments by said electromagnetic radiation passing through said segments being cancelled out at said intersection by the phase shift of 180° more or less differential between the edges of said segments.

* * * * *

UNITED STATES PATENT AND TRADEMARK OFFICE
CERTIFICATE OF CORRECTION

PATENT NO. : 6,277,527 B1
DATED : August 21, 2001
INVENTOR(S) : David S. O'Grady et al.

Page 1 of 1

It is certified that error appears in the above-identified patent and that said Letters Patent is hereby corrected as shown below:

Column 3,
Line 32, after "mask of Fig," insert -- 1 --.

Column 7, claim 11,
Line 56, delete "than" and insert -- from an edge of --.

Drawings,
Replace the informal drawings as originally filed with the attached formal drawings.

Signed and Sealed this

Ninth Day of April, 2002

Attest:

Attesting Officer

JAMES E. ROGAN
Director of the United States Patent and Trademark Office